US 6,737,877 B1

(12) United States Patent
Hatton et al.

(10) Patent No.: US 6,737,877 B1
(45) Date of Patent: May 18, 2004

(54) METHOD AND CIRCUIT FOR READING A POTENTIOMETER

(75) Inventors: Barry S. Hatton, Escondido, CA (US); David G. Wright, Escondido, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/232,920

(22) Filed: Aug. 30, 2002

(51) Int. Cl.[7] .................. G01R 31/08; G01R 27/26; G01R 27/08
(52) U.S. Cl. .................. 324/723; 324/535; 324/677; 324/678; 324/714
(58) Field of Search .................. 324/723, 525, 324/714, 691, 699, 711, 677, 678, 658, 532, 535, 662, 672, 673

(56) References Cited

U.S. PATENT DOCUMENTS 3,571,764 A * 3/1971 Koenigk .................. 333/28 T
4,987,372 A * 1/1991 Ofori-Tenkorang et al. 324/705
5,563,519 A * 10/1996 Honkanen .................. 324/676
6,472,859 B1 * 10/2002 Tippy et al. .............. 324/76.11
6,577,297 B1 * 6/2003 Wright .................. 345/161

OTHER PUBLICATIONS

U.S. patent application Ser. No. 09/821,680, filed Mar. 29, 2001.

* cited by examiner

Primary Examiner—N. Le
Assistant Examiner—John Teresinski
(74) Attorney, Agent, or Firm—Marger Johnson & McCollom, P.C.

(57) ABSTRACT

Embodiments of the invention describe a method and apparatus used to determine the position of a wiper on a potentiometer without the need for an external ADC. Two capacitors are each connected to an end of a potentiometer, and then are charged or discharged simultaneously by a current source or current sink attached to the wiper of the potentiometer. The time required for each of the capacitors to charge or discharge to a threshold voltage level is measured and subsequently used to determine the position of the wiper on the potentiometer.

20 Claims, 6 Drawing Sheets

No Transition

90    0 0 0 0 1 1 1 1  
91    x x x x 1 1 1 1  
92    0 0 0 0 1 1 1 1  
93    0 0 0 0 0 0 0 0

Transition

METHOD AND CIRCUIT FOR READING A POTENTIOMETER

TECHNICAL FIELD OF THE INVENTION

This disclosure relates to reading a potentiometer, and more particularly, to digitally reading an analog potentiometer without the need for an ADC (Analog to Digital Converter).

BACKGROUND OF THE INVENTION

Traditionally, both PC (Personal Computer) and USB (Universal Serial Bus) gamepads have been simple "digital" devices, made of a set of buttons that are used for both directional control (e.g., arranged as a "thumb pad") and for feature activation such as firing weapons in a game. More recently, Game Consoles such as the Sony® Playstation® and Microsoft® Xbox™ have been developed to support gamepads that provide various analog controls, including "thumb sticks" for directional control and "proportional triggers." Providing such analog controls allows the game user to have a more "natural" gaming experience, which in turn increases his or her enjoyment in playing the games.

Analog position-sensing controls used by some gamepads and joysticks typically use potentiometers to generate a variable voltage based on the position of the control. This approach requires an expensive ADC to convert the analog signals into digital values that can be manipulated by a microprocessor. Additionally, the analog sensors are susceptible to various electrical conditions including center-point calibration, temperature drift, and noise.

Connected Xbox™ game peripherals communicate with their game console using a restricted implementation of the USB implementation. Typically, the peripherals incorporate both a USB peripheral manager to manage the game controller functions and a USB hub to provide an interface for "add-in" modules, such as memory cards, which may be inserted into the peripheral. Common peripheral implementations use a USB hub microcontroller together with an external ADC (used to read the potentiometers), or use a standard USB hub IC together with a USB peripheral microcontroller having an integrated ADC.

Embodiments of the invention address the concerns discussed above.

SUMMARY OF THE INVENTION

Embodiments of the invention include a method that allows nearly any microcontroller to accurately read a potentiometer with minimal external components. Some embodiments include two capacitors connected to the respective ends of a potentiometer, which can be charged or discharged simultaneously by a current source or current sink attached to the wiper of the potentiometer. The time when the voltage of each capacitor charges or discharges to a predetermined level is recorded and subsequently used to determine the position of the wiper on the potentiometer. Some embodiments of the invention includes, for example, first and second charge storage devices coupled to a physical input device; and a circuit for determining a position of the physical input device by comparing charge or discharge time for the first and second charge storage devices.

BRIEF DESCRIPTION OF THE DRAWINGS

The foregoing and other features and advantages of the invention will become more readily apparent from the following detailed description of a preferred embodiment of the invention which proceeds with reference to the accompanying drawings.

DETAILED DESCRIPTION

Embodiments of the invention add capacitors with fixed values to the terminal ends of the potentiometer. The resulting RC circuit will charge or discharge the capacitors at a rate proportional to the variation in resistance. By measuring the time required for the capacitor voltage to charge or discharge to a threshold voltage level, the variable resistances of the potentiometer, and in turn the position of the potentiometer wiper, can be determined by the microcontroller without the need for an ADC.

Figure 1A:
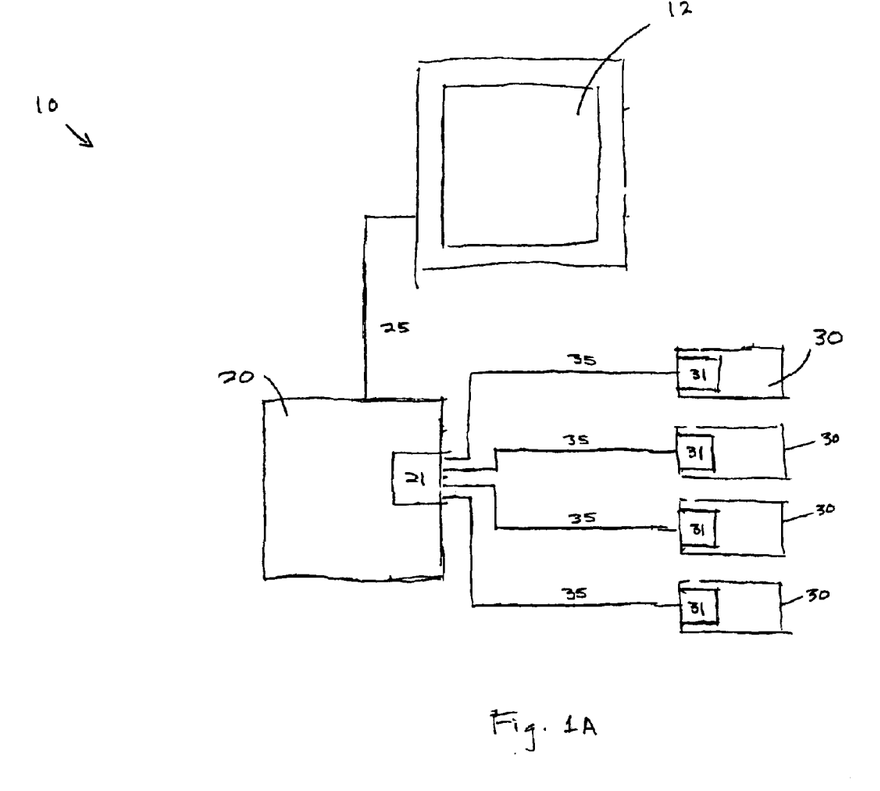
FIG. 1A is a block diagram showing a typical configuration for a gaming device that includes a game console, game peripherals, and a display device.

FIG. 1A is a block diagram showing a typical configuration for a gaming device 10. The gaming device 10 includes a display device 12, a game console 20, and one or more game controllers 30. The game console 20 is structured to receive inputs from up to four game controllers 30, each of which contains a game peripheral unit 31. The peripheral units 31 communicate with a processing unit 21 which resides on the game console 20 by using a restricted implementation of one of the USB specifications over communication lines 35. The game console 20 uses the information from one of more of the peripheral units 31 to form a series of video game images, which are sent to the display device 12 over communication line 25 for display to the video game players.

Figure 1B:
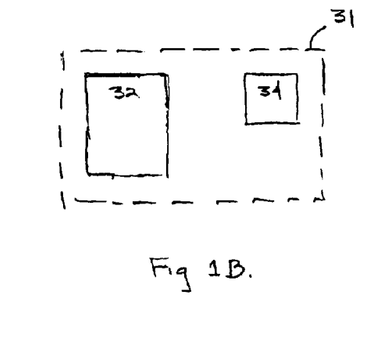
FIG. 1B is a block diagram showing one commonly used method of implementing the game peripherals illustrated in FIG. 1A.
Figure 1C:
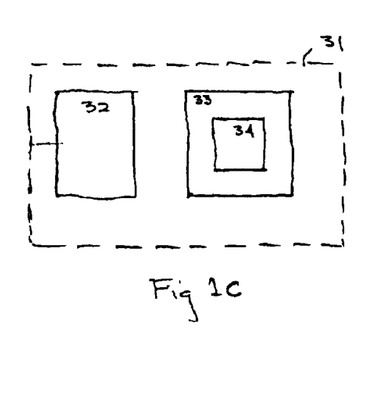
FIG. 1C is a block diagram showing another commonly used method of implementing the game peripherals illustrated in FIG. 1A.

Conventional game peripheral units 31 have typically been implemented in one of two ways, as shown in FIG. 1B and FIG. 1C. Both implementations include a USB hub 32, which can use, for example, a microcontroller. The USB hub 32 can be used in conjunction with an external ADC 34 as shown in FIG. 1B. Alternatively, as shown in FIG. 1C, the ADC 34 may be integrated in a USB peripheral 33, which can also use a microcontroller. The USB peripheral 33 manages the game controller 30 functions such as position and menu selection, while the USB hub 32 provides additional interfaces to support "add-in" modules such as memory cards. In both cases, the ADC 34 is used to read the potentiometers (not shown) on the game controllers 30 to ascertain the position of the analog controls manipulated by the video game players.

Figure 2A:
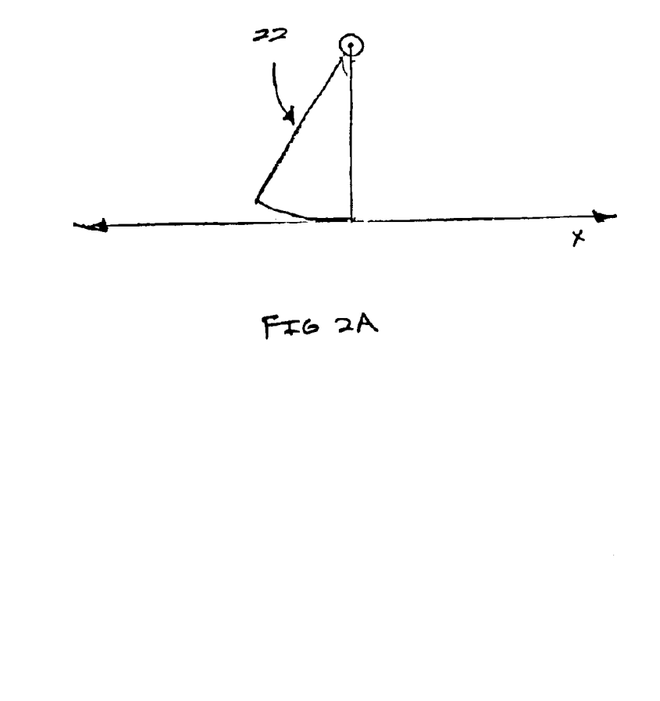
FIG. 2A is an illustration of a uniaxial trigger implemented with a single potentiometer that can be sensed by embodiments of the invention.

FIG. 2A is an illustration of a uniaxial trigger 22 implemented using a single potentiometer. Reading the potentiometer determines the physical position of the trigger relative to a "full rest" position when no force is moving the trigger 22 from its natural position, and a "full on" position when the trigger 22 is moved to the end of its mechanical limits. Similarly, FIG. 2B shows a biaxial thumbpad 23 implemented with two potentiometers that are used to measure the position of any pressure applied to the face of the thumbpad.

Generally, for analog controls associated with game controllers, one potentiometer is required for each axis of movement. For example, the trigger 22 of FIG. 2A requires only one potentiometer since movement is restricted to one axis. However, the thumbpad 23 shown in FIG. 2B uses two potentiometers, because two axes are necessary to specify the position of any pressure applied to the face of the thumbpad.

Figure 3:
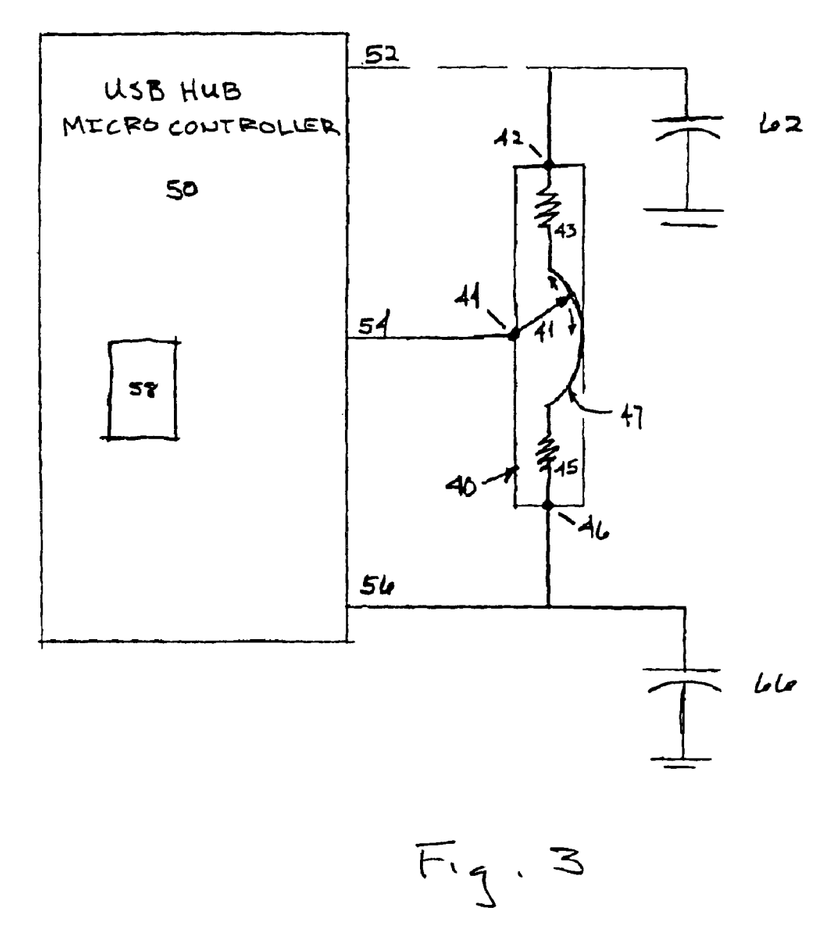
FIG. 3 is a block diagram showing an example configuration of an embodiment of the invention.

FIG. 3 is a schematic diagram illustrating an embodiment of the invention. A potentiometer 40 has a first end terminal 42 and a second end terminal 46 that are electrically connected to each end of the conductive track 47 of the potentiometer 40. The first end terminal 42 is coupled to an input/output pin 52 of a USB hub microcontroller 50, while the second end terminal 46 is coupled to an input/output pin 56. Additionally, the potentiometer 40 includes a wiper terminal 44 that is electrically connected to the wiper 41 of the potentiometer 40. The wiper terminal 44 is coupled to an output pin 54 of the USB hub microcontroller 50.

Figure 2B:
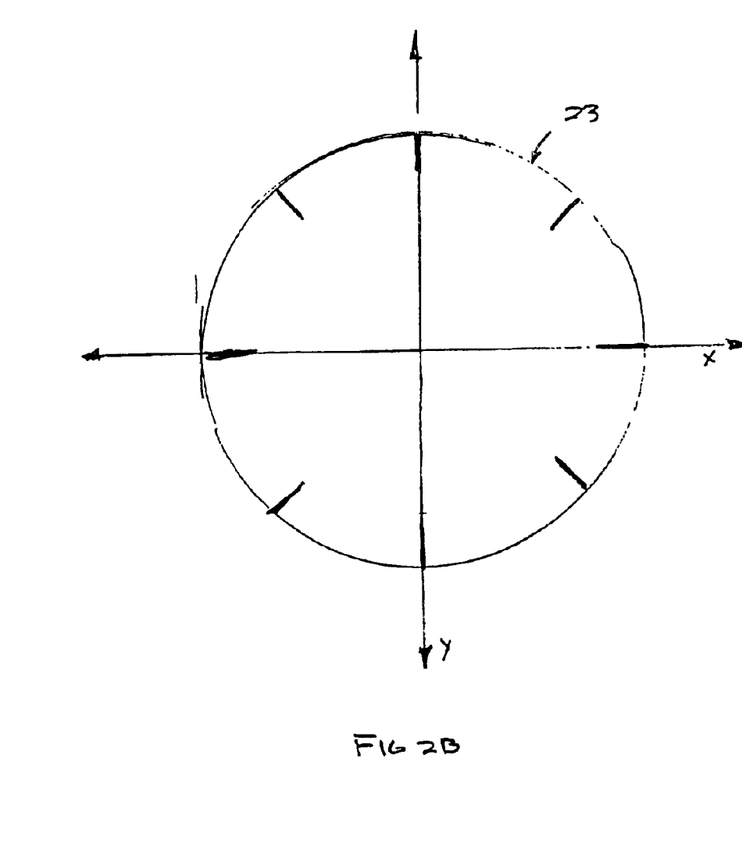
FIG. 2B is an illustration of a biaxial thumbpad implemented with a pair of potentiometers that can be sensed by embodiments of the invention.

The wiper 41 of potentiometer 40 can be physically attached to the trigger 22 of FIG. 2A, or to one axis of the thumbpad 23 of FIG. 2B, for instance. Squeezing the trigger 22 or moving the thumbpad 23 causes the wiper 41 to physically travel along the length of the conductive track 47 of potentiometer 40.

The position of the wiper 41 on the conductive track 47 determines the value of a variable resistance 43 by lengthening or shortening the electrical path between the first end terminal 42 and the wiper terminal 44. The position of wiper 41 on the conductive track 47 also determines the value of a variable resistance 45 by lengthening or shortening the electrical path between the second end terminal 46 and the wiper terminal 44. The sum of the variable resistances 43, 45 is a constant.

The relative position of the wiper 41 can be determined by signals generated by a circuit coupled to the end terminals 42, 46 and the wiper terminal 44, as discussed in detail below. Additionally, two capacitors 62, 66 with substantially equal capacitances are respectively coupled between the input/output pins 52, 56 and a reference voltage.

Figure 4:
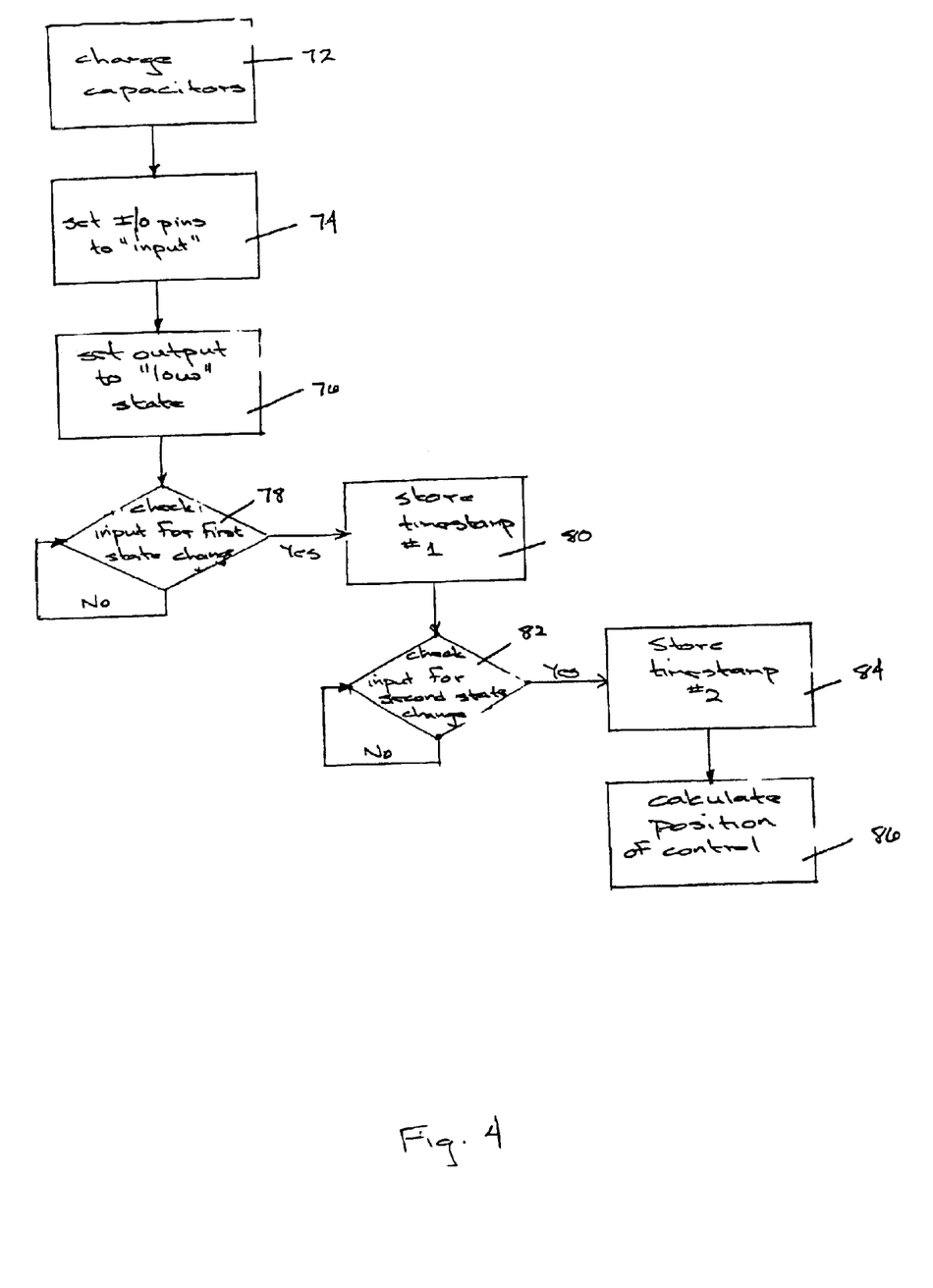
FIG. 4 is an example flow diagram illustrating processes that can be used in embodiments of the invention.

FIG. 4 is an example flow diagram illustrating how embodiments of the invention can effectively measure the position of an analog control such as the potentiometer 40 of FIG. 3. First, in a process 72, the input/output pins 52, 56 and the output pin 54 are driven to a "high" state for a sufficient period of time to ensure that the capacitors 62, 66 are fully charged. Conversely, the input/output pins 52, 56 and the output pin 54 could be driven to a "low" state for a sufficient period of time to ensure that the capacitors 62, 66 are fully discharged.

At process 74, both input/output pins 52, 56 are configured as inputs. Next, at process 76, the output pin 54 is set to "low". This causes the output pin 54 to become a current sink and both of the capacitors 62, 66 simultaneously begin to discharge through their respective variable resistances 43, 45 into the output pin 54 that is configured as the current sink. Specifically, the capacitor 62 discharges through the variable resistance 43 of the potentiometer 40 into output pin 54, while the capacitor 66 discharges through the variable resistance 45 of the potentiometer 40 into output pin 54. Alternatively, if the capacitors 62, 66 were initially fully discharged at process 72, setting the output pin 54 to "high" would cause the output pin 54 to function as a current source and the capacitors 62, 66 would simultaneously start to charge, each through their respective variable resistances 43, 45.

Next, a check 78 determines if a state change occurred at either of the input/output pins 52, 56. For example, in the case where fully charged capacitors 62, 66 are discharging, the state change occurs when either of the capacitors 62, 66 discharges past a predetermined threshold level. Check 78 periodically samples the voltage at input/output pins 52, 56 and compares the sampled voltage to the predetermined threshold level to determine if a state change from high to low has occurred. Conversely, if the capacitors 62, 66 were instead simultaneously charged from a fully discharged state, process 78 would operate to detect changes from a low state to a high state on input/output pins 52, 56. The actual time required for the capacitors 62, 66 to charge or discharge to a threshold level is a function of the variable resistances 43, 45 that are determined by the position of the wiper 41 of potentiometer 40.

General purpose input/output pins provided by microcontrollers may support either TTL or CMOS levels which can be used for threshold detection, but embodiments of the invention can be used even if the microcontroller only supports a single voltage level. In any event, it is typically more desirable to detect a voltage threshold that is greater than zero, since the polling process then occurs during the portion of the discharging or charging waveform that most approximates a linear function.

According to process 80, when the first state change is detected from either input/output pin 52 or input/output pin 56, a first timestamp from a free-running timer 58 located in microcontroller 50 is stored. The timer 58 could also be separate from the microcontroller 50. For example, firmware executing on the USB hub microcontroller 50 can store the present state of the timer 58. Meanwhile, a check 82 continues to monitor for a state change on the input/output pin 52 or 56 that has not yet changed state. When that event occurs, as indicated at process 84, a second timestamp from the free-running timer 58 is stored, for example, by the firmware.

In an alternate process, the timer 58 could be started when the first state change event occurred, and stopped when the second state change event occurred.

Finally, at process 86, the position of the analog control can be calculated by comparing the stored timestamp values. For example, the position may be determined by subtracting the timestamp triggered by the state change at input/output pin 52 from the timestamp triggered by the state change at input/output pin 56. Alternatively, the position could also be determined by subtracting the timestamp triggered by the state change at input/output pin 56 from the timestamp triggered by the state change at input/output pin 52. There is no difficulty with using either method as long as the same method is used consistently.

In the calculation performed at process 86, a difference of zero indicates the potentiometer is in the center position.

Positive or negative values merely indicate which of the variable resistances in potentiometer 40 was greater. For example, if the chosen method was to subtract the timestamp obtained from input/output pin 52 from the timestamp obtained from input/output pin 56 and the resulting difference was negative, it follows that the timestamp obtained from input/output pin 56 was chronologically earlier than the timestamp obtained from input/output pin 52. This necessarily means that capacitor 66 required less time to charge or discharge to a threshold level than capacitor 62. Since the capacitance values of the two capacitors 62, 66 are substantially equal the conclusion must be that variable resistance 45 has a smaller value than variable resistance 43.

The full scale value is determined using the constant sum of the variable resistances 43, 45, the capacitance values of the capacitors 62, 66, and the clock frequency of the free running timer. With the difference between the two timestamps and the full scale value, the microcontroller can accurately determine the position of the potentiometer.

In the embodiment of the present invention represented by check 78 and check 82 in FIG. 4, polling loops are preferred to interrupts because interrupts typically exhibit variable latencies. The variable latencies can create a variation of several microseconds in the time between the event taking place and timestamp being recorded, which could seriously affect the accuracy of the potentiometer readings. The time through the polling loops should be as close to equal as possible each time the loop is executed, regardless of the route taken through any of the program branches. Generally, when polling loops are used, interrupts should be turned off, to ensure the polling is not interrupted. Interrupts could also be turned on, but in that case the Interrupt Service Routine for all enabled interrupts must be aware that they might be interrupting the potentiometer reading. In that case a message passing protocol allowing the potentiometer reading to be aborted or discarded if an interrupt takes place while the reading is being taken should be used.

In another embodiment, a microcontroller that features "capture timers" can be used. In that case polling the two input/output pins 52, 56 for a state change becomes unnecessary, as the capture timers can be configured to automatically record the timestamp. Using this method would further reduce the variation in time between a state change and the recording of the timestamp and subsequently improve the measurement accuracy.

The described embodiments of the present invention allow almost any microcontroller to accurately measure the position of the potentiometer wiper, without the need for costly external components or specialized on-chip features. Additionally, the embodiments of the invention yield much more accurate readings than other conventional approaches. A further advantage to embodiments of the invention is that the effects of aging of the potentiometer are minimized. For example, because the two capacitors 62, 66, of FIG. 3 are being charged or discharged simultaneously, the effect of the loss of contact between the wiper 41 and the conductive track 47 of the potentiometer 40 as the conductive track 47 wears out over time is substantially reduced.

Other advantages are that no center-position calibration of the potentiometer is required, since the position is inherently considered centered when the difference between the two timestamps is zero. There is also increased immunity to temperature drift and to high and low frequency noise.

Figure 5A:
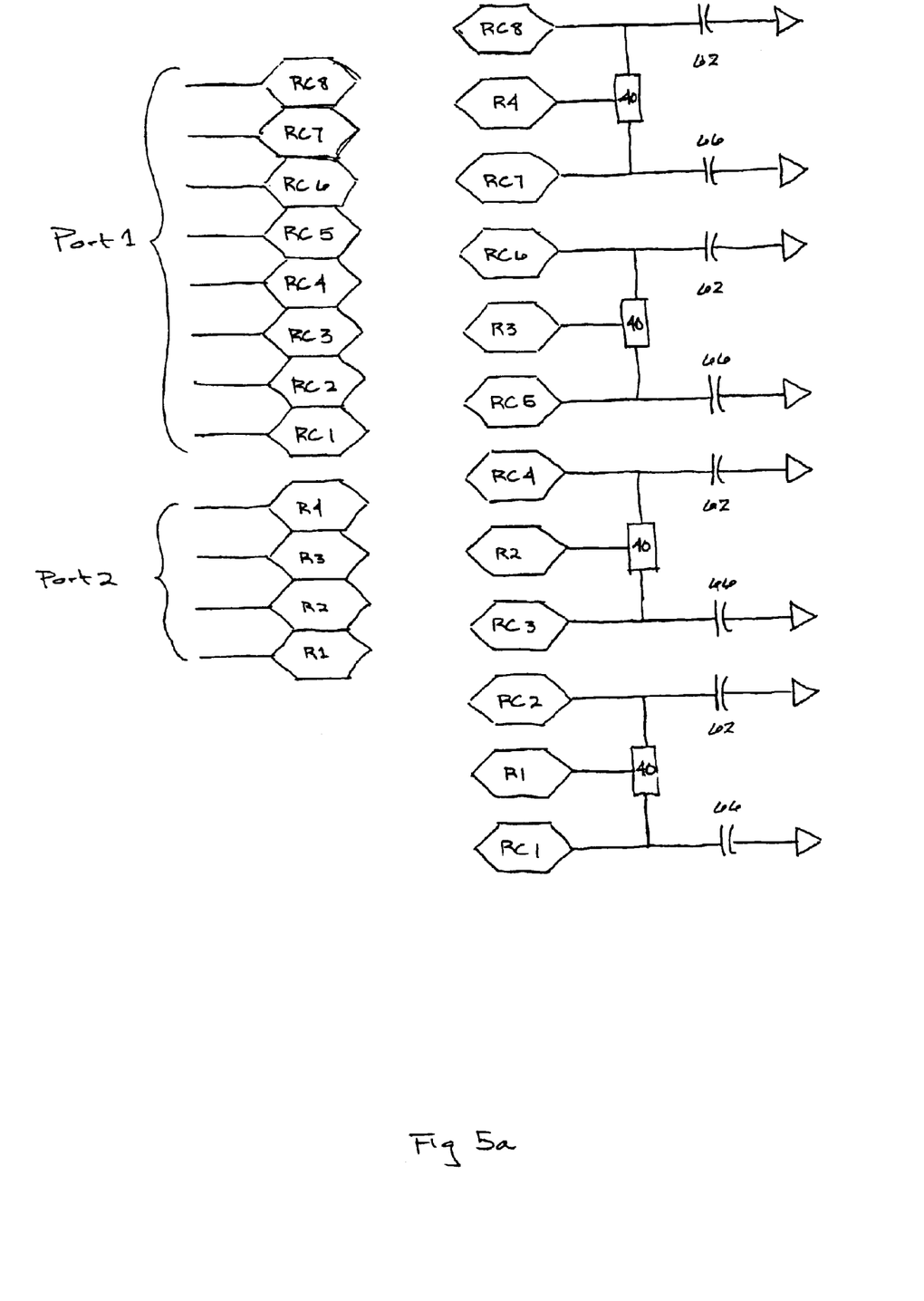
FIG. 5A is a partial schematic diagram illustrating a device capable of sampling multiple parallel potentiometers according to embodiments of the invention.

FIG. 5A is a partial schematic diagram illustrating a device capable of sampling multiple parallel potentiometers according to embodiments of the invention. Parallel sample operation is achieved by connecting eight input/output channels RC1–RC8 to a common Port 1 that can be read in parallel by the microcontroller. Similarly, the four output channels R1–R4 are connected to a common Port 2.

Figure 5B:
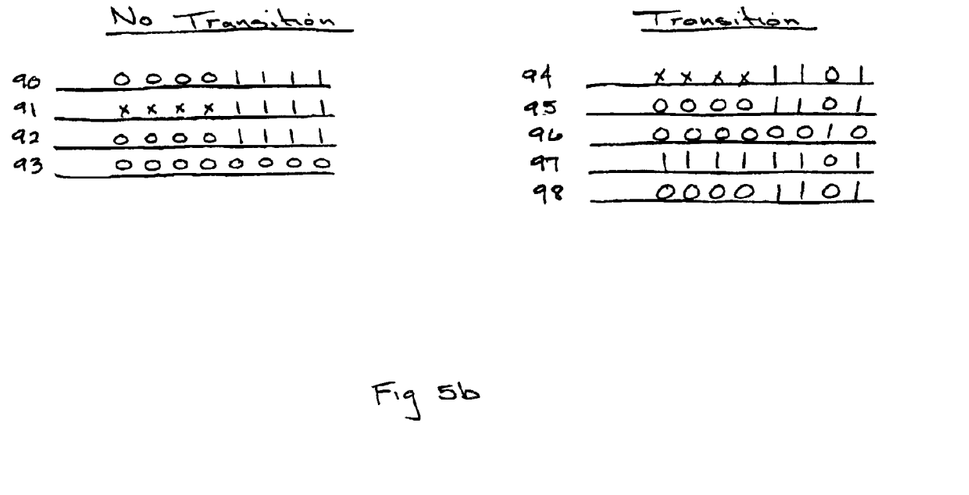
FIG. 5B shows examples of some bitmap patterns used by the device shown in FIG. 5A when it is performing sampling operations of multiple parallel potentiometers according to embodiments of the invention.

FIG. 5B shows examples of some bitmap patterns used by the device shown in FIG. 5A when it is performing sampling operations of multiple parallel potentiometers according to embodiments of the invention.

With reference to FIGS. 5A and 5B, a variable 'active' is loaded with a bitmap pattern 90 indicating the inputs that should be actively sampled. Here, the most significant bit of bitmap pattern 90 corresponds to channel RC8 and the least significant bit of bitmap pattern 90 corresponds to channel RC1. Bitmap pattern 90 indicates that channels RC1, RC2, RC3, and RC4 are to be read and channels RC5–RC8 are not to be read. The microcontroller 50 reads each of the required channels simultaneously by reading Port 1.

If none of the input/output channels sampled have transitioned to a low state, the resulting sample of Port 1 will appear as in bitmap pattern 91. AND'ing bitmap pattern 91 with the 'active' variable (bitmap pattern 90) results in bitmap pattern 92. Subsequently XOR'ing bitmap pattern 92 with the 'active' variable results in bitmap pattern 93, indicating that none of the channels monitored has transitioned from a high state to low state.

Conversely, if one of the channels (in this case RC2) has transitioned from a high to low state, the resulting sample of Port 1 appears as in bitmap pattern 94. As in the case for no transition, bitmap pattern 94 is first AND'ed with the 'active' variable (bitmap pattern 90) to achieve bitmap pattern 95. Bitmap pattern 95 is then XOR'ed with the 'active' variable to achieve bitmap pattern 96. Bitmap pattern 96 indicates that channel RC2 has transitioned from a high to low state. To minimize processing overhead during a time-critical period, in some embodiments bitmap pattern 96 can be saved to a variable 'edges' and a snapshot of the free-running timer saved to a variable 'sample'. Both the 'edges' and 'sample' variables are arrays that can hold as many snapshots as the maximum number of entries. After a transition is detected, bitmap pattern 96 is inverted to achieve bitmap pattern 97, which is then AND'ed with the 'active' variable to achieve bitmap pattern 98. Bitmap pattern 98 then becomes the new 'active' variable, indicating that channel RC2 no longer must be sampled.

The process then continues as described above until all the active channels have transitioned. This is indicated when the 'active' variable is equal to zero. At this time, in some embodiments of the invention firmware will use the values stored in the arrays 'edges' and 'sample' to calculate the wiper position for each potentiometer that was actively sampled according to the process described above for FIGS. 4 and 5.

Thus, by using embodiments of the invention, a microcontroller or other circuit can quickly and effectively read a potentiometer or potentiometers without using an ADC.

It will be apparent to those skilled in this art that the illustrated embodiments are exemplary and that various changes and modifications may be made thereto as become apparent upon reading of the present disclosure. Accordingly, such changes and modifications are considered to fall within the scope of the appended claims.

Further, the specification may refer to "an", "one", "another", or "some" embodiment(s) in various locations. It will be understood, however, that such use does not necessarily mean that each such reference is directed to the same embodiment(s), or that the features thereof only apply to a single embodiment.

We claim:

1. A method for determining a relative position of a wiper of a potentiometer, comprising:

recording a first timer reading when a voltage of a first capacitor that is coupled to a first end of the potentiometer reaches a first reference voltage;

recording a second timer reading when a voltage of a second capacitor that is coupled to a second end of the potentiometer reaches the first reference voltage; and comparing the first and second timer readings.

2. The method of claim 1, wherein the first capacitor discharges current through the wiper, and wherein the wiper is coupled to a current sinking pin of a microcontroller.

3. The method of claim 2, wherein the microcontroller is a Universal Serial Bus microcontroller.

4. The method of claim 1, wherein recording a first timer reading comprises polling an input pin of a microcontroller coupled to the first end of the potentiometer for a change in logic state.

5. The method of claim 1, further comprising, prior to recording the first or second timer reading, charging at least one of the capacitors to a second reference voltage through the wiper.

6. The method of claim 1 wherein the first capacitor and the second capacitor discharge current simultaneously.

7. The method of claim 1, wherein comparing the first and second timer readings comprises subtracting one of the timer readings from the other timer reading.

8. A method for determining a relative position of a wiper of a potentiometer, comprising:

charging, to a first reference voltage, a first capacitor coupled between a first end of the potentiometer and a second reference voltage;

charging, to the first reference voltage, a second capacitor coupled between a second end of the potentiometer and the second reference voltage;

discharging the first and second capacitor; and comparing a first timer reading taken when a voltage of the first capacitor equals a third reference voltage to a second timer reading taken when a voltage of the second capacitor equals the third reference voltage.

9. The method of claim 8, wherein discharging the first capacitor comprises discharging through the wiper, and wherein the wiper is coupled to a current sinking pin of a microcontroller.

10. The method of claim 9, wherein the microcontroller is a Universal Serial Bus microcontroller.

11. The method of claim 8, further comprising polling a microcontroller input pin coupled to the first capacitor to determine when the voltage of the first capacitor equaled the third reference voltage.

12. The method of claim 8, wherein comparing the first timer reading to the second timer reading produces a result, the method further comprising interpolating the result on a scale ranging from a number representing a maximum negative displacement position of the wiper to a number representing a maximum positive displacement of the wiper.

13. The method of claim 8, wherein discharging the first and second capacitor occurs simultaneously.

14. A device for reading a potentiometer, comprising:

a first capacitor coupled to a first end of the potentiometer;

a second capacitor coupled to a second end of the potentiometer;

a voltage generator coupled to a wiper of the potentiometer;

a timer structured to measure a first time period for the first capacitor to change a voltage from a first level to a second level, and structured to measure a second time period for the second capacitor to change a voltage from the first level to the second level; and a comparator structured to compare the first time period to the second time period.

15. The device of claim 14, wherein the comparator is structured to subtract the second time period from the first time period.

16. The device of claim 14, further comprising a charging circuit structured to charge the capacitors to the first reference level.

17. The device of claim 16, wherein the charging circuit is structured to source current through the wiper.

18. The device of claim 14, wherein the wiper is coupled to a pin of a microcontroller.

19. The device of claim 18, wherein the pin is a programmable input/output pin of a USB microcontroller.

20. The device of claim 14, further comprising a second comparator structured to compare a difference between the first time period and the second time period to a reference representing a full scale potentiometer reading.

* * * * *